(12) United States Patent
Lee et al.

(10) Patent No.: US 8,519,480 B2
(45) Date of Patent: Aug. 27, 2013

(54) ELECTROSTATIC DISCHARGE PROTECTION DEVICE

(75) Inventors: Yang-Han Lee, Taoyuan County (TW); Chun Chang, Taipei (TW)

(73) Assignee: Princeton Technology Corporation, Xindian Dist., New Taipei (TW)

( * ) Notice: Subject to any disclaimer, the term of this patent is extended or adjusted under 35 U.S.C. 154(b) by 302 days.

(21) Appl. No.: 12/907,041

(22) Filed: Oct. 19, 2010

(65) Prior Publication Data

US 2011/0095368 A1   Apr. 28, 2011

(30) Foreign Application Priority Data

Oct. 23, 2009  (TW) ................................ 98135891 A

(51) Int. Cl.
*H01L 23/62* (2006.01)
*H01L 21/336* (2006.01)

(52) U.S. Cl.
USPC ............ 257/360; 257/E21.545; 257/E23.002; 438/294

(58) Field of Classification Search
None
See application file for complete search history.

(56) References Cited

U.S. PATENT DOCUMENTS 5,913,122 A * 6/1999 Lee et al. ...................... 438/297
2002/0105368 A1* 8/2002 Morishita ..................... 327/310

* cited by examiner

*Primary Examiner* — Michael Lebentritt
*Assistant Examiner* — Kevin Quinto
(74) *Attorney, Agent, or Firm* — Winston Hsu; Scott Margo

(57) ABSTRACT

An electrostatic discharge protection device is disclosed. The electrostatic discharge protection device preferably includes a first transistor, a second transistor, and an electrostatic discharge clamping circuit. The first transistor includes a first drain electrically connected to an input/output pin of a chip, a first source electrically connected to a first voltage input pin of the chip, and a first gate. The first drain is preferably an internally shrunk drain. The second transistor includes a second drain electrically connected to the input/output pin of the chip, a second source electrically connected to a second voltage input pin and a second gate. The electrostatic discharge clamping circuit is electrically connected to the first voltage input pin and the second voltage input pin.

19 Claims, 3 Drawing Sheets

ELECTROSTATIC DISCHARGE PROTECTION DEVICE

BACKGROUND OF THE INVENTION

1. Field of the Invention

The invention relates to an electrostatic discharge protection device, and more particularly, to an electrostatic discharge protection device with internally shrunk doping region at drain end.

2. Description of the Prior Art

Electrostatic discharge (ESD) is a major factor responsible for the damage of electrical overstress (EOS) of most electronic elements or electronic systems. The damaged electronic elements or electronic systems may be either temporarily disabled or permanently destroyed. This kind of unexpected electrical overstress destruction results in the damage of the electronic elements, adversely influencing the integrated circuits (IC) and making the electronic products fail to function.

The causes of the electrostatic discharge may come from various reasons and are usually inevitable. Static charges may accumulate in human bodies, devices, storages equipments during the manufacture, assembly, testing, storage of the electronic elements or electronic systems, even the electronic elements themselves may accumulate static charges. Static charges discharge when objects contact one another and damage takes its toll.

The object to equip the integrated circuits with the electrostatic discharge protection circuit is to protect the integrated circuits from the damage of the electrostatic discharge. The CMOS technique dominates the current semiconductor circuits. The electrostatic discharge may harm the delicate semiconductor chips in many ways. For example, the discharged charges punch through the thin gate insulator inside the elements or harm MOSFET and CMOS. Accordingly, if the integrated circuits are equipped with the electrostatic discharge protection circuit, they may function normally in the presence of the electrostatic discharge. On the contrary, the integrated circuits without the electrostatic discharge protection circuit may not function well in the presence of the electrostatic discharge. Even further, the chip may be partially disabled or potentially destroyed without obvious signs.

In conventional electrostatic discharge protection device architecture, the doping regions in the source or drain are typically connected to the surrounding field oxide layers directly. Hence, as the device undergoes electrostatic discharge testing, such as when electrical current flows from the drain, passes through the channel under the gate and to the source, the electrical current has the tendency to concentrate at the surface of the channel region and destroy the entire device.

Hence, how to improve the architecture of current electrostatic discharge protection device to provide a device with better stability and ability to safely release electrostatic current has become an important task.

SUMMARY OF THE INVENTION

It is an objective of the present invention to provide an electrostatic discharge protection device for resolving the aforementioned issues found in conventional electrostatic discharge protection device.

An electrostatic discharge protection device is disclosed. The electrostatic discharge protection device includes: a first transistor having a first drain electrically connected to an input/output pin of a chip, a source electrically connected to a first voltage input pin of the chip, and a first gate, wherein the first drain is an internally shrunk drain; a second transistor having a second drain electrically connected to the input/output pin, a second source electrically connected to a second voltage input pin, and a second gate; and an electrostatic discharge clamping circuit electrically connected to the first voltage input pin and the second voltage input pin.

Another aspect of the present invention provides an electrostatic discharge protection device. The electrostatic discharge protection device includes a first transistor, a second transistor, and an electrostatic discharge clamping circuit. The first transistor includes a first source electrically connected to a first voltage input pin of a chip, wherein the source comprises a first doping region and a second doping region disposed in the first doping region; a first drain electrically connected to an input/output pin of the chip, wherein the first drain comprises a third doping region and a fourth doping region disposed in the third doping region and the fourth doping region being an internally shrunk doping region; and a first gate. The second transistor has a second drain electrically connected to the input/output pin, a second source electrically connected to a second voltage input pin of the chip, and a second gate. The electrostatic discharge clamping circuit is electrically connected to the first voltage input pin and the second voltage input pin.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
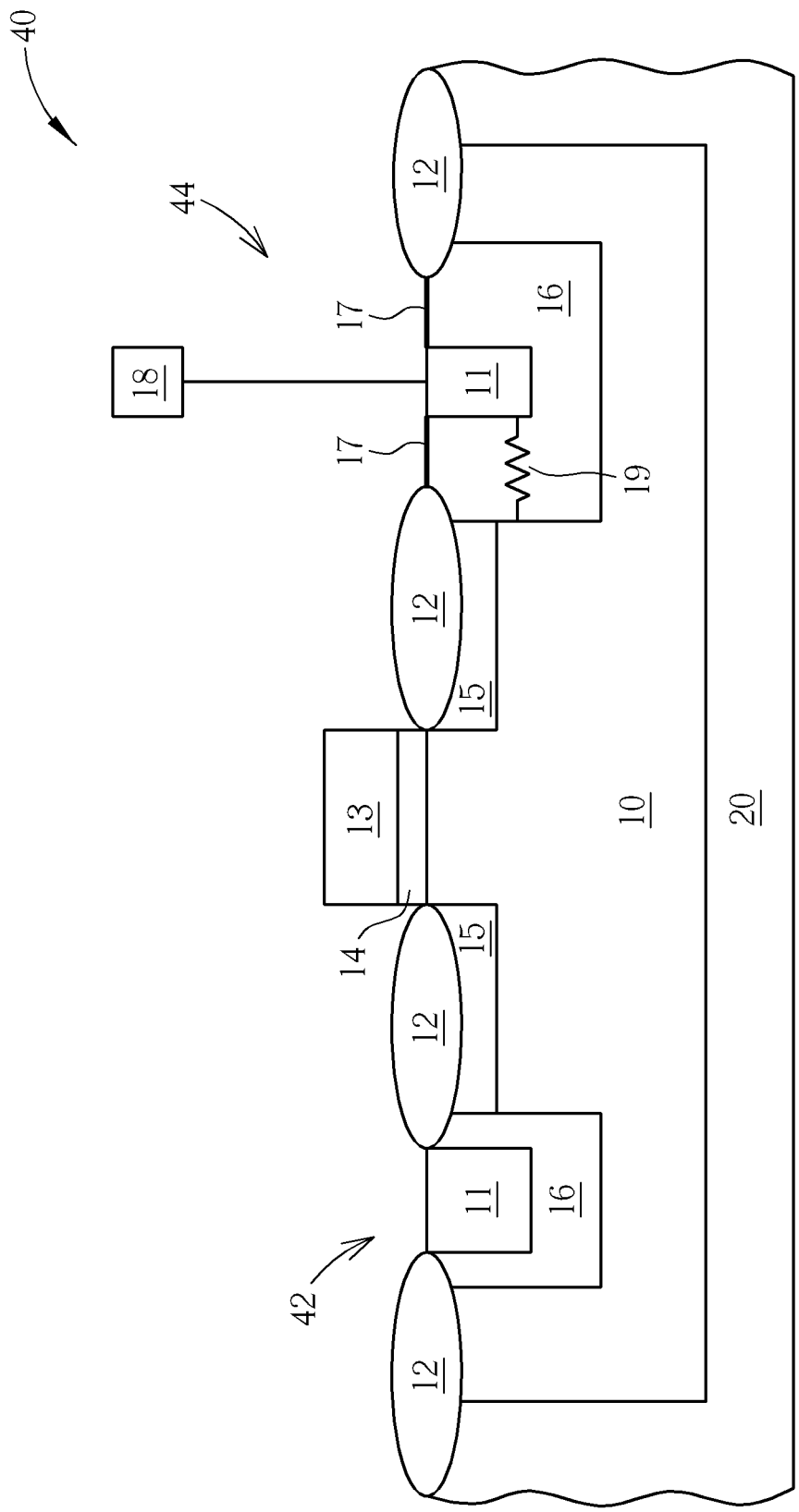
FIG. 1 illustrates a structural view of a high voltage NMOS transistor of an electrostatic discharge protection device according to a preferred embodiment of the present invention.
Figure 2:
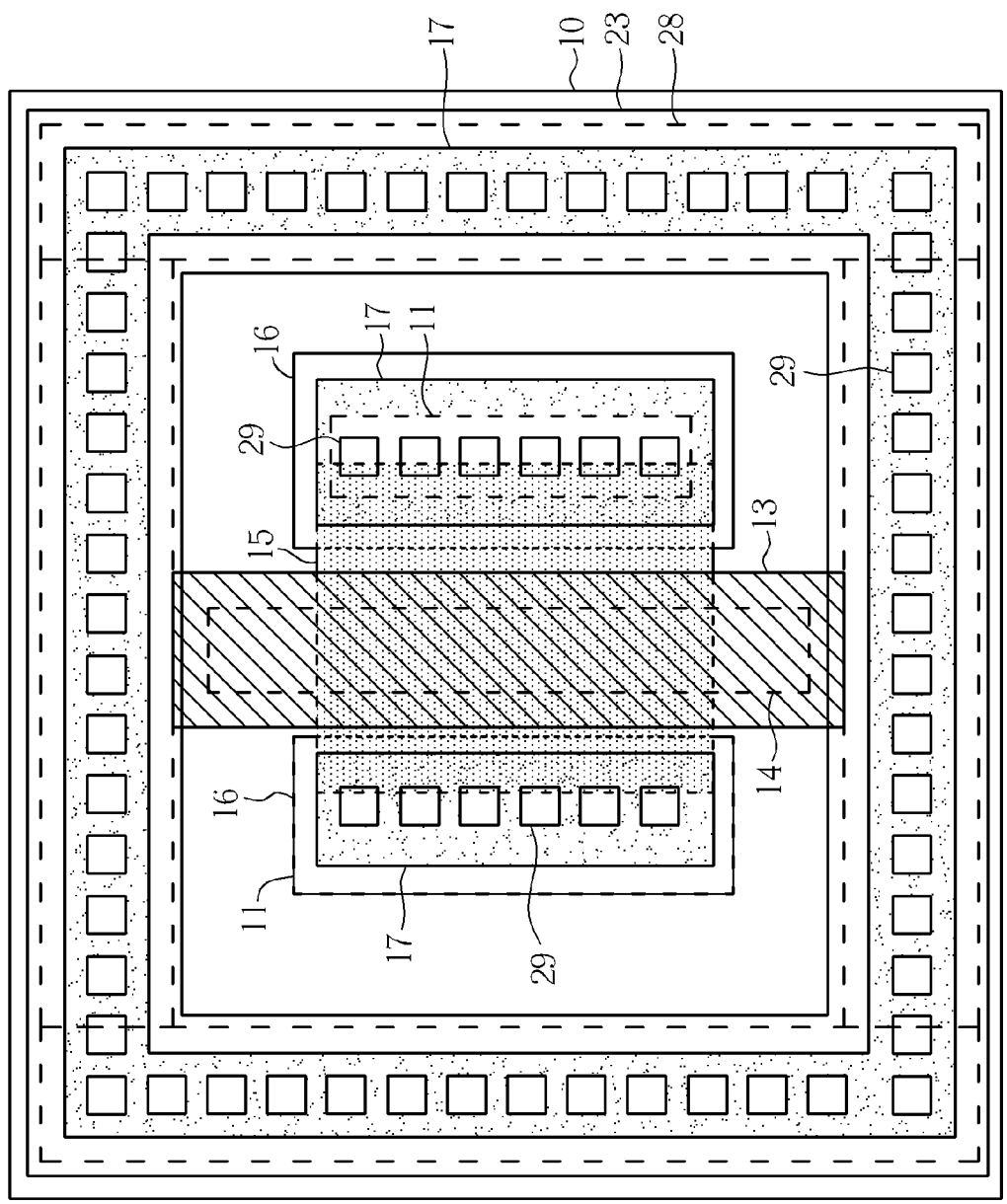
FIG. 2 illustrates a layout diagram of the NMOS transistor shown in FIG. 1.

Referring to FIGS. 1-2, FIG. 1 illustrates a structural view of a high voltage NMOS transistor 40 of an electrostatic discharge protection device according to a preferred embodiment of the present invention, and FIG. 2 is a layout diagram of the NMOS transistor 40 shown in FIG. 1. The fabrication of the NMOS transistor 40 is provided below according to FIGS. 1-2. First, a semiconductor substrate 20, such as a silicon substrate is provided. P-type ion implantation process is conducted to form a P-well 10, such as a high voltage P-well in the semiconductor substrate 20. Next, a lightly doped ion implantation is performed by using a patterned photoresist (not shown) as mask to implant n-type dopants into the semiconductor substrate 20 to form a plurality of N-drift regions 15. Next, an isolation and field oxide fabrication is conducted to form a plurality of field oxide layers 12 composed of silicon oxide and a p-type isolation structure 23 on a surface of the P-well 10.

Next, a patterned photoresist (not shown) is used as mask to form a plurality of N-grade regions 16 in the P-well 10 between the field oxide layers 12. An oxide layer (not shown) with a depth preferably between 850 Angstroms to 900 Angstroms and a polysilicon layer (not shown) with a depth preferably between 1000 Angstroms to 2000 Angstroms are then deposited on surface of the semiconductor substrate 20. A photo-etching process is then conducted on the oxide layer and the polysilicon layer to form a patterned gate oxide layer 14 and a gate 13 thereon.

Next, a heavy ion implantation is performed by using a patterned photoresist (not shown) as mask to implant n-type dopants in the N-grade regions 16 between the field oxide layers 12 to form a plurality of N+ regions 11. The N-grade regions 16 and the N+ regions 11 disposed in the semiconductor substrate 20 adjacent to two sides of the gate 13 preferably constitute a source 42 and a drain 44 of the NMOS transistor 40 of the present invention. Next, an oxidation process is performed to form a thin oxide layer 17 with a thickness between 150 Angstroms to 220 Angstroms on surface of the N-grade region 16 surrounding the N+ region 11 of the drain 44.

It should be noted that the present invention selectively adjusts the region covered by the patterned photoresist during the aforementioned heavy ion implantation process, such as by using the patterned photoresist to simultaneously cover the region not intended to be implanted with n-type dopants and a portion of the surface of the N-grade region 16 at the drain 44, and then uses the patterned photoresist as mask to carry out the aforementioned heavy ion implantation to form an N+ region 11 in the N-grade region 16 of the source 42 and an internally shrunk N+ region 11 in the N-grade region 16 of the drain 44. Preferably, the N+ region 11 at the source 42 end contacts the adjacent field oxide layers 12 while the N+ region 11 at the drain 44 end does not physically contact the field oxide layer 12 around the drain 44. In this embodiment, the thin oxide layer 17 not doped with n-type dopants is exposed through the distance formed between the internally shrunk N+ regions 11 and the adjacent field oxide layers 12. Thereafter, another patterned photoresist could be used to form a P+ region 28 surrounding the NMOS transistor 40 on the p-type isolation structure 23.

An interlayer dielectric layer (not shown) composed of oxides or nitrides is deposited on the NMOS transistor 40, and a contact plug fabrication is performed to form a plurality of contact plugs 29 electrically connecting the source 42 and the drain 44. In this embodiment, the contact plug 29 of the source 42 is electrically connected to an input/output pin, and the contact plug 29 at the source 44 is electrically connected to a voltage input/output pin 18, such as a low voltage VSS input/output pin.

An electrostatic discharge protection structure is also disclosed according to the aforementioned fabrication. As shown in FIG. 1, the NMOS transistor 40 includes a semiconductor substrate 12, a P-well 10 disposed in the semiconductor substrate 20, a gate oxide layer 14 disposed on the semiconductor substrate 20, a gate 13 disposed on the gate oxide layer 14, a source 42 formed in the semiconductor substrate 20 adjacent to one side of the gate 13, a drain 44 formed in the semiconductor substrate 20 adjacent to the other side of the gate 13, and a plurality of field oxide layers 12 disposed between the gate 13, the source 42, and the drain 44.

In this embodiment, each of the source 42 and the drain 44 is composed of an N-grade region 16 and an N+ region 11, in which each N+ region 11 is disposed in the N-grade region 16. The source 42 is electrically connected to a voltage input pin of a chip, and the N+ region 11 of the source 42 is formed to contact the surrounding field oxide layers 12 of the N-grade region 16. The drain 44 I electrically connected to an input/output pin 18 of the chip, and the N+ region 11 of the drain 44 preferably not contacting the surrounding field oxide layer 12 thereby forming an internally shrunk doping region. In other words, a distance is formed between the N+ region 11 of the drain 44 and the surrounding field oxide layers 12 to expose the thin oxide layer 17 formed on surface of the semiconductor substrate 20.

According to a preferred embodiment of the present invention, the internally shrunk nature of the N+ region is used to increase the resistance 19 at surface of the semiconductor substrate 20 of the drain 44 end, such that as electrical current from electrostatic discharge passes through the drain 44, it would flow into the P-well 10 instead of concentrating at the surface of the channel region. This not only prevents electrical current of electrostatic discharge from damaging the entire device, but also evenly distributes the thermal energy throughout the device.

It should be noted that despite the electrostatic discharge protection device is implemented by the aforementioned NMOS transistor, the electrostatic discharge protection device could also be implemented by following the aforementioned steps with relative dopants to fabricate PMOS transistors with internally shrunk drain, which is also within the scope of the present invention.

Figure 3:
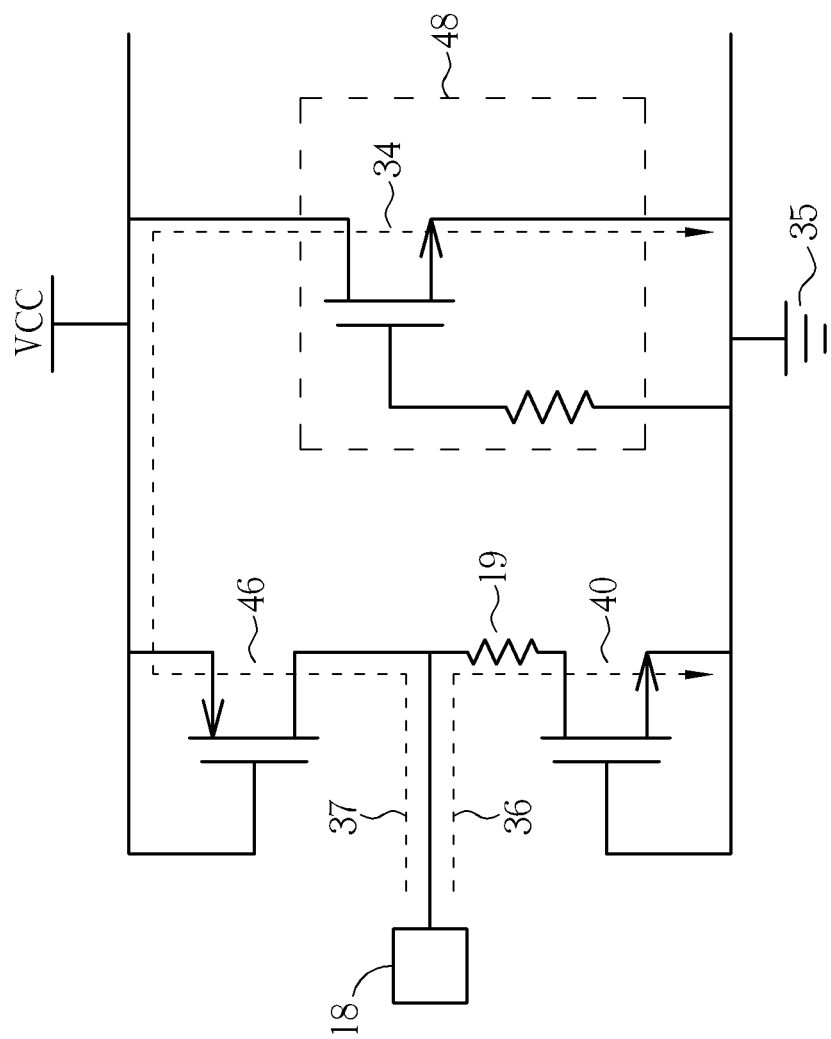
FIG. 3 illustrates a circuit diagram of an electrostatic discharge protection device according to a preferred embodiment of the present invention.

Referring to FIG. 3, which illustrates a circuit diagram of an electrostatic discharge protection device according to a preferred embodiment of the present invention. As shown in the figure, the electrostatic discharge protection device includes a PMOS transistor 46, an NMOS transistor 40, and an electrostatic discharge clamping circuit 48. The drain of the PMOS transistor 46 is electrically connected to an input/output pin 18 of a chip, and the source of the PMOS transistor 46 is electrically connected to a high voltage input pin of the chip, such as a high voltage VCC. The drain of the NMOS transistor 40 is electrically connected to the input/output pin 18, and the source of the NMOS transistor 40 is electrically connected to a low voltage input pin of the chip, such as a low voltage source 35. The electrostatic discharge clamping circuit 48 is disposed between the PMOS transistor 46 and the NMOS transistor 40, and connected to the high voltage source VCC and the low voltage source 35. The electrostatic discharge clamping circuit 48 includes a transistor 34 electrically connected between the high voltage source VCC and the low voltage source 35, in which the size of the transistor 34 could be designed substantially greater than the size of PMOS transistor 46 or NMOS transistor 40.

As shown in FIG. 3, the path of electrical current under PS mode static pressure test includes path 36 and path 37, and it has been found that due to small size, conventional high voltage NMOS transistors are often destroyed by electrostatic discharge current as they are used as input or output pin of the device. By applying the NMOS transistor structure shown in FIG. 1 to a PS mode static pressure test, the internally shrunk N+ region at the drain of the NMOS transistor could be used to provide a higher resistance at the surface of the substrate, thereby directing the electrostatic discharge current to flow into the high voltage P-well instead of concentrating on the surface of the channel region. In other words, the internally shrunk nature of the N+ region could be used to increase the overall area of the N-grade region and as the N-grade region includes a lower doping concentration, the resistance at the drain end is increased substantially while not affecting the operation of the NMOS transistor. Moreover, as the resistance generated at the path 36 of the NMOS transistor 40 inhibits conductivity, the path 37 is preferably used for the electrostatic discharge testing.

Those skilled in the art will readily observe that numerous modifications and alterations of the device and method may be made while retaining the teachings of the invention.

What is claimed is:

1. An electrostatic discharge protection device, comprising:
    a first transistor having a first drain electrically connected to an input/output pin of a chip, a first source electrically connected to a first voltage input pin of the chip, and a first gate, wherein the first drain is an internally shrunk drain, wherein the first source comprises a first doping region and third doping region, and a second doping region is disposed in the first doping region and a fourth doping region is disposed in the third doping region;
    a second transistor having a second drain electrically connected to the input/output pin, a second source electrically connected to a second voltage input pin, and a second gate; and
    an electrostatic discharge clamping circuit electrically connected to the first voltage input pin and the second voltage input pin.

2. The electrostatic discharge protection device of claim 1, further comprising a thin oxide layer disposed on an exposed surface of the third doping region surrounding the fourth doping region; and a plurality of field oxide layers disposed between the first gate, the first doping region, and the third doping region.

3. The electrostatic discharge protection device of claim 2, wherein the fourth doping region of the first drain includes an internally shrunk doping region insulated from the field oxide layers, and wherein the second doping region of the first source is adjacent to the field oxide layers.

4. The electrostatic discharge protection device of claim 1, wherein each of the first doping region and the third doping region comprises an N-grade region, and each of the second doping region and the fourth doping region comprises an N+ region.

5. The electrostatic discharge protection device of claim 1, wherein each of the first doping region and the third doping region comprises a P-grade region, and each of the second doping region and the fourth doping region comprises a P+ region.

6. The electrostatic discharge protection device of claim 1, wherein the electrostatic discharge clamping circuit further comprises a third transistor electrically connected to the first voltage input pin and the second voltage input pin.

7. An electrostatic discharge protection device, comprising:
    a first transistor having a first source, a first drain, and a first gate, wherein the first source electrically connected to a first voltage input pin of a chip, wherein the source includes a first doping region with a second doping region disposed in the first doping region, wherein the first drain electrically connected to an input/output pin of the chip, wherein the first drain has a third doping region and a fourth doping region disposed in the third doping region and the fourth doping region is an internally shrunk doping region;
    a second transistor having a second drain electrically connected to the input/output pin, a second source electrically connected to a second voltage input pin of the chip, and a second gate; and
    an electrostatic discharge clamping circuit electrically connected to the first voltage input pin and the second voltage input pin.

8. The electrostatic discharge protection device of claim 7, further comprising a thin oxide layer disposed on an exposed surface of the third doping region surrounding the fourth doping region.

9. The electrostatic discharge protection device of claim 7, further comprising a plurality of field oxide layers disposed between the first gate, the first doping region, and the third doping region.

10. The electrostatic discharge protection device of claim 9, wherein the fourth doping region of the first drain insulates from the field oxide layer, and wherein the second doping region of the first source is adjacent to the field oxide layers.

11. The electrostatic discharge protection device of claim 7, wherein each of the first doping region and the third doping region includes an N-grade region, and each of the second doping region and the fourth doping region includes an N+ region.

12. The electrostatic discharge protection device of claim 7, wherein each of the first doping region and the third doping region comprises a P-grade region, and each of the second doping region and the fourth doping region comprises a P+ region.

13. The electrostatic discharge protection device of claim 7, wherein the electrostatic discharge clamping circuit further comprises a third transistor electrically connected to the first voltage input pin and the second voltage input pin.

14. A method for fabricating an electrostatic discharge protection device, comprising:
    providing a semiconductor substrate;
    forming a gate on the semiconductor substrate;
    forming a source in the semiconductor substrate on one side of the gate and electrically connected to a voltage input pin of a chip; and
    forming a drain in the semiconductor substrate on the other side of the gate and electrically connecting to an input/output pin of the chip, wherein the source has a first doping region and a second doping region disposed in the first doping region, wherein the drain has a third doping region and a fourth doping region disposed in the third doping region, wherein the fourth doping region being an internally shrunk doping region.

15. The method of claim 14, further comprising forming a thin oxide layer on an exposed surface of the third doping region surrounding the fourth doping region; and
    forming a plurality of field oxide layers between the first gate, the first doping region, and the third doping region.

16. The method of claim 14, wherein the fourth doping region of the drain is insulated from the field oxide layers, and wherein the second doping region of the source is adjacent to the field oxide layers.

17. The method of claim 14, wherein each of the first doping region and the third doping region includes an N-grade region, and each of the second doping region and the fourth doping region comprises an N+ region.

18. The method of claim 14, wherein each of the first doping region and the third doping region includes a P-grade region, and each of the second doping region and the fourth doping region includes a P+ region.

19. The method of claim 14, further comprising forming an ion well in the semiconductor substrate, wherein the first doping region, the second doping region, the third doping region, and the fourth doping region are disposed in the ion well.

* * * * *